United States Patent

Turchi et al.

[11] Patent Number: 5,760,496
[45] Date of Patent: Jun. 2, 1998

[54] INVERSE-PINCH VOLTAGE PULSE GENERATOR

[75] Inventors: Peter J. Turchi, Worthington, Ohio; James H. Degnan, Albuquerque, N. Mex.

[73] Assignee: The United States of America as represented by the Secretary of the Air Force, Washington, D.C.

[21] Appl. No.: 636,616

[22] Filed: Apr. 23, 1996

[51] Int. Cl.⁶ .................................... H01J 27/02
[52] U.S. Cl. .................. 307/106; 331/87; 315/84.51; 315/84.61; 315/111.21; 315/111.41
[58] Field of Search ............................ 307/106, 157; 331/87, 129, 130; 333/20; 325/100; 315/500, 501, 84.51, 84.61, 111.21, 111.41, 363

[56] References Cited

U.S. PATENT DOCUMENTS

| | | | |
|---|---|---|---|
| Re. 32,505 | 9/1987 | Hensley et al. | 313/141 |
| 4,189,650 | 2/1980 | Aaland | 307/108 |
| 4,255,731 | 3/1981 | Birx | 333/258 |
| 4,314,879 | 2/1982 | Hartman et al. | 376/128 |
| 4,318,029 | 3/1982 | Jergenson | 315/111.81 |
| 4,402,036 | 8/1983 | Hensley et al. | 313/138 |
| 4,422,013 | 12/1983 | Turchi et al. | 315/111.81 |
| 4,450,568 | 5/1984 | Asmus | 372/71 |
| 4,475,066 | 10/1984 | Lee | 315/111.01 |
| 4,494,043 | 1/1985 | Stallings et al. | 315/111.41 |
| 4,687,617 | 8/1987 | Janos et al. | 376/137 |
| 4,758,795 | 7/1988 | Ripin et al. | 330/4 |
| 4,897,556 | 1/1990 | Springfield et al. | 307/106 |
| 5,048,163 | 9/1991 | Asmus et al. | 29/25.01 |
| 5,103,186 | 4/1992 | Keingis | 328/237 |
| 5,382,866 | 1/1995 | Boggasch et al. | 313/231.31 |
| 5,401,543 | 3/1995 | O'Neill et al. | 427/580 |
| 5,504,795 | 4/1996 | McGeoch | 378/119 |
| 5,608,297 | 3/1997 | Goebel | 315/111.41 |

*Primary Examiner*—William M. Shoop, Jr.
*Assistant Examiner*—Peter Ganjian
*Attorney, Agent, or Firm*—Robert L. Nathans

[57] ABSTRACT

A first magnetic flux field is produced in the vicinity of a generally cylindrical pulse generating coil arrangement and a plasma is abruptly and radially displaced outwardly toward the coil arrangement, which in turn displaces the first magnetic flux field to a sufficient degree to enable it to cut across the output coil to generate an output pulse. Displacement of the plasma is effected by producing a second magnetic field transverse to the direction of the first magnetic field and to the direction of current within the plasma by means of a longitudinal, centrally positioned conductor coupled to a source of electrical power.

17 Claims, 1 Drawing Sheet

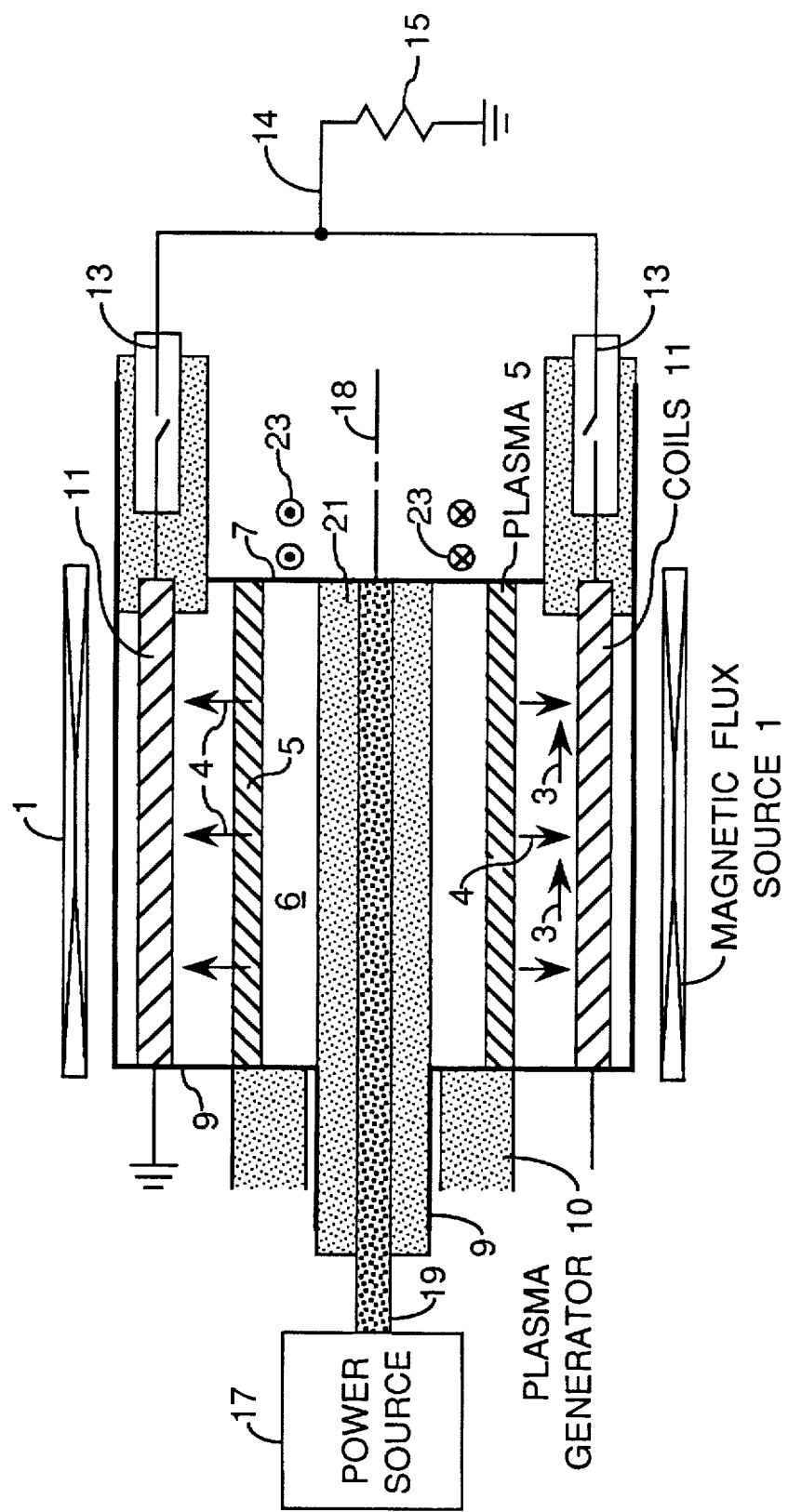

INVERSE-PINCH VOLTAGE PULSE GENERATOR

STATEMENT OF GOVERNMENT INTEREST

The invention described herein may be manufactured and used by or for the Government for governmental purposes without the payment of any royalty thereon.

BACKGROUND OF THE INVENTION

Conventional techniques for generating fast-rising, high-voltage pulses generally involve high-voltage capacitors and a plurality of high-voltage, closing-switches in arrangements such as Marx generators. High voltages are also generated from lower voltage pulses by means of transformers. In this case, the output pulse generally follows the risetime and duration of the input pulse.

Magnetic flux compression generators, usually known as explosive-generators or magnetocumulative generators (MCGs) can be used to generate moderately high voltages, typically, tens of kilovolts, at very high currents, namely tens of megamps. Transformer techniques and various current-interrupter schemes have been used to obtain desired higher voltages and shorter pulses, but such techniques generally increase the size, weight and complexity of the system. Furthermore, explosively-driven metal armatures in MCGs typically require much more energy per shot than needed by the load simply to operate at sufficiently high magnetic Reynolds number. This results in local destruction of the generator system and precludes repetitive pulsing.

For several years, interest has been developing in the use of high-energy, charged-particle beams in applications that require mobile sources of high voltage. Typically, electron energies are 0.5 to 1 MeV, so similar output voltages are needed from an appropriate pulse generator. The pulsetimes of interest are a few microseconds or less. Traditionally, such voltage pulses are obtained from the aforesaid Marx generators, often in combination with pulselines and transformers. Such generator systems however, may require more space and weight than are allowed by mobile applications. Thus, there is a need to eliminate the requirement for large numbers of high-voltage switches and to achieve reductions in size and weight associated with energy storage. The Inverse-Pinch Pulser (IPP) of the present invention employs a dynamic plasma discharge to displace magnetic flux, thereby inducing high voltages across multi-turn coils. Typical operating parameters are voltages of 0.5 to 1 MV, pulsetimes in the microsecond regime and output impedances in the few ohm range. The use of capacitor-bank sources to drive the inverse-pinch discharge would permit repetitive operation of the IPP at rates of several kHz, which are important for some military needs. The ability to use compact energy sources, such as explosive generators and relatively low-voltage, high energy-density capacitors, permits employment of the IPP in mobile applications.

BRIEF SUMMARY OF THE INVENTION

In accordance with one embodiment of the invention, a first magnetic flux field is positioned in the vicinity of a multi-turn output coil device and a cylindrical plasma is abruptly and radially displaced outwardly toward the coil device, which displacement also radially displaces the first magnetic flux field to a sufficient degree to cut across the output coil device to generate an output pulse from the system. The outward radial displacement of the plasma can be effected by producing a second magnetic field transverse to the direction of current within the plasma and also transverse to the first magnetic field.

BRIEF DESCRIPTION OF THE DRAWING

Other features, aspects and advantages of the invention will become more apparent upon study of the following detailed description taken in conjunction with the drawings in which the sole FIGURE schematically illustrates a preferred embodiment of the invention, whereby the aforesaid components are coaxially positioned about a central longitudinal axis.

DETAILED DESCRIPTION OF PREFERRED EMBODIMENTS OF THE INVENTION

The inverse-pinch pulse generator of the invention preferably comprises cylindrical apparatus having a generally cylindrical magnetic flux source 1 which creates an axially extending first magnetic field represented by arrows 3. A cylindrical plasma discharge 5 is produced in a vacuum chamber 6 within the device and between electrode 7 and ground electrode 9, by a conventional plasma generator means, 10. Insulated multi-turn coils 11 are electrically coupled between ground electrode 9 and a low impedance load 15, via switches 13 and leads 14.

Electrical power source 17 causes coaxial conductor 19, supported by insulator sleeve 21 about longitudinal reference axis 18, to function as a plasma displacement means, which produces an azimuthal second magnetic field indicated by arrows 23, and which radially and outwardly abruptly accelerates cylindrical dynamic expanding inverse-pinch plasma discharge 5, owing to the interaction of this azimuthal magnetic flux with current through the plasma. This radial acceleration of the plasma is indicated by arrows 4, and causes outward radial displacement of the axially extending magnetic flux 3 in the direction of arrows 4 and away from axis 18. This flux, abruptly cutting through coil means 11, produces a desired high voltage pulse. Plasma displacement speeds of 50–100 km/sec are sufficient to cause the desired flux displacement past the multi-turn coil means 11, which induces high output voltage pulses across load 15, which can have a 0.2–1.0 megavolt amplitude. Power source 17 is either an explosive magnetic flux compression single shot generator for portable use, or a capacitor or capacitor array/bank for re-usable or repetitive use.

An inverse pinch discharge is an axial plasma discharge in which the outer conductor is a cylindrical shell plasma sheath, and the inner conductor is a cylindrical metal rod or shell. A normal pinch, or z pinch, is an axial plasma discharge in which the outer conductor is a single metallic shell, and the inner conductor is a cylindrical shell plasma current sheath. The latter is more commonly used and known. In inverse pinches, there is a magnetic field pressure inside the cylindrical shell plasma current sheath between the inner and outer conductor. This pressure causes the plasma current sheath to move in an outward direction. In normal pinches, there is also magnetic field pressure between the inner and outer conductor, but the inner conductor is the plasma sheath that is free to move, so that the sheath is driven inwardly, that is, pinched or imploded. Normal pinches are used to compress or heat plasmas, and their performance is limited by instability of growth. Inverse pinches in contrast, are resistent to the major instability that normal pinches are subjected to. For the inverse pinch, portions of the plasma sheath that are deformed outwardly toward larger radii are pushed by a weaker magnetic field pressure, and the deformity which shrinks, becomes less extreme. This situation is said to be stable and inverse pinches have more perfect symmetry than normal pinches. While this is not beneficial for direct pinch compression and heating of plasmas, it does enable more symmetric compression or displacement of external magnetic flux produced by the separate solenoid discharge in the inverse pinch pulse generator of the present invention.

The preferred embodiment of the invention thus employs an inverse-pinch discharge, a source of axial magnetic field 1; and a multi-turn coil or set of multi-turn coils 11 that will experience an induced voltage when the expanding plasma displaces magnetic flux from the region interior to the coil(s). The inverse-pinch discharge takes the form of a cylindrical plasma shell or liner 5, shown in the figure, that is accelerated outward radially due to the interaction of axial current flow through the coaxial solid-metal conductor 19 interior to the plasma liner. Plasma speeds of 50–100 km/s are sufficient to induce azimuthal current in the outer surface of the plasma shell and thereby displace magnetic flux. This displacement past the multi-turn coil or alternatively, the increase in magnetic field in a plurality of multi-turn coils at separate azimuthal stations due to magnetic flux compression induces high voltages between the ends of the coil(s) 11. These voltages can then be used to drive a high impedance load 15 via lead 14, such as electron-beam diode:

The formulation of the design of the IPP starts with the basic equation for the voltage induced in the multi-turn coil:

$$\Delta V = N \, d\phi/dt$$

where N is the number of turns in the coil and $\phi$ is the magnetic flux through the cross-sectional area normal to the magnetic field, of a single turn of the coil. The magnetic flux is the product of the magnetic induction B and this coil area, and is computed differently for the case of a plurality of multi-turn coils at separate azimuthal locations vs the case of a single coil that surrounds the axis of symmetry of the IPP. In the former case, if $A_{coil}$ is the cross-sectional area of the coil, normal to the magnetic field lines, and B is the magnetic field through this cross-sectional area $$d\phi/dt = A_{coil} \, dB/dt$$

The rate of change of magnetic field is $$dB/dt = 2B_o(r_t^2 - r_{po}^2) r_p(t) u_p(t) / [(r_t^2 - rp(t)^2)]^2$$

where $B_o$ is the initial magnetic field provided by the separate source of magnetic flux, $r_t$ is the radius, of the flux source (which is assumed here to conserve the enclosed flux on the timescale of plasma expansion), $r_p(t)$ is the radius of the expanding plasma, which starts at a radius $r_{po}$, and $u_p(t)$ is the plasma expansion speed. The net output voltage of the several separate coils will depend on the series/parallel connections of these coils.

For the case of the multi-turn coil surrounding the axis of symmetry 18 and the plasma liner 5, the rate of change of magnetic flux within the coil is $$d\phi/dt = -2\pi B_o(r_t^2 - r_{po}^2)(r_t^2 - r_c^2) \, r_p u_p /[(r_t^2 - r_p(t)^2)]^2$$

where $r_c$ is the radius of the coil. Note that the voltage is negative because the flux surrounded by the coil is decreasing with time. The polarity of the output pulse can be changed simply by reversing the direction of the initial magnetic field.

In both cases, the output power vs voltage of the IPP depends on the current through the coil(s). This current is determined by the load impedance, but is limited by the mechanical strength of the coil because of the force of interaction between the coil current and the axial magnetic field. These forces may be readily evaluated using standard techniques based on derivatives of the mutual inductances between coils including the expanding plasma cylinder as a single-turn coil, coupled to appropriate circuit equations for the source, load and plasma.

The central portion of the IPP closely resembles large-radius inverse-pinch plasma discharge devices found in some switching schemes and in the initiation of certain coaxial plasma guns. Manufacturing the IPP follows standard procedures for high-voltage insulation and vacuum sealing found in such devices. The coaxial source coil for the magnetic flux and the multi-turn coils can also be designed and manufactured in accord with standard practices for laboratory plasma apparatus.

The advantage of the present invention over conventional techniques for generating high-voltage pulses, such as Marx generators, is based on elimination of the size, weight and complexity that conventional techniques require for energy storage and switching. Saving in regard to energy storage is obtained by using compact, low-impedance sources, such as MCGs or relatively low-voltage capacitors, to drive the inverse-pinch discharge. Multiple switches needed for several stages of Marx generator are replaced with multiple turns of wire in the high-voltage output coil of the IPP.

The IPP may have some advantages over the Magnetic Voltage-Pulser (MVP) in design situations for which the larger area (lower intensity) of coil and armature interaction in the IPP permits longer lifetime. Like the MVP, the IPP has advantages over conventional MCGs because plasma conductors can achieve the necessary values of magnetic Reynolds number for magnetic flux compression without requiring the high energy densities of explosively-driven, solid-metal conductors that result in local destruction of the generator. This advantage depends on the application and does not matter if local destruction is part of the overall system design.

Variations of the two basic cases of IPP operation include the use of other techniques to obtain the expanding cylindrical conductor instead of an inverse-pinch discharge. These techniques may comprise solid-metal cylinders expanded by explosive action, and explosively-shocked gas usually seeded with materials to enhance electrical conductivity.

While preferred embodiments of the invention have been set forth above, other variations of the foregoing will be apparent to the skilled worker in the art within the true spirit of the invention, and thus the scope of the invention is to be limited only by the terms of the following claims and equivalents thereto.

What is claimed is:

1. An electrical pulse generator comprising:
  (a) coil means having an axis positioned substantially parallel with respect to a pulse generator reference axis;
  (b) a magnetic flux source for producing a magnetic field substantially parallel to said reference axis;
  (c) plasma generator means for producing a plasma substantially parallel with respect to said reference axis; and
  (d) plasma displacement means for abruptly accelerating said plasma outwardly in a direction away from said reference axis for in turn causing an abrupt displacement of said magnetic field in the vicinity of said coil means to cause said coil means to produce a voltage pulse.

2. The generator of claim 1 wherein said plasma displacement means includes means for producing a second magnetic field transverse to the direction of current within said plasma.

3. The generator of claim 2 wherein said plasma displacement means produces a plasma speed of 20–50 km/sec.

4. The generator of claim 2 wherein said plasma displacement means includes an axially extending conductor coupled to an electrical power source for producing said second magnetic field.

5. The generator of claim 1 wherein said plasma displacement means produces a plasma displacement speed of 20–50 km/sec.

6. The generator of claim 1 wherein said plasma generator means produces a plasma comprising an inverse-pinch discharge.

7. An electrical pulse generator comprising:

(a) a generally cylindrical coil means positioned coaxially with respect to a central longitudinal pulse generator reference axis;

(b) a magnetic flux source for producing a magnetic field substantially parallel to said longitudinal reference axis and in the vicinity of said coil means;

(c) plasma generator means for producing a cylindrical plasma substantially parallel with respect to said longitudinal reference axis; and (d) plasma displacement means for abruptly accelerating said cylindrical plasma outwardly in a direction substantially perpendicular with respect to said central longitudinal reference axis for in turn causing an abrupt displacement of said magnetic field in the vicinity of said coil means to cause said coil means to produce a voltage pulse.

8. The generator of claim 7 wherein said plasma displacement means includes means for producing a second magnetic field transverse to the direction of current within said plasma and also transverse to the first magnetic field.

9. The generator of claim 8 wherein said plasma displacement means produces a plasma displacement speed of 20–50 km/sec.

10. The generator of claim 8 wherein said plasma displacement means includes a conductor positioned along said axis and coupled to an electrical power source for producing said second magnetic field.

11. The generator of claim 7 wherein said plasma displacement means produces a plasma displacement speed of 20–50 km/sec.

12. The generator of claim 7 wherein said plasma generator means produces a plasma comprising an inverse-pinch discharge.

13. An electrical pulse generator comprising:

(a) an inductor;

(b) a magnetic flux source for producing a magnetic flux field adjacent to and alongside said inductor;

(c) plasma generator means for producing a plasma current sheath; and (d) plasma displacement means for causing an abrupt radial expansion of said plasma current sheath and said magnetic field in the vicinity of said inductor sufficient to cause said inductor to produce an output pulse.

14. The generator of claim 13 wherein said plasma displacement means includes means for producing a second magnetic field transverse to the direction of current within said plasma current sheath.

15. The generator of claim 14 wherein said plasma displacement means includes an axially extending conductor coupled to an electrical power source for producing said second magnetic field.

16. The generator of claim 14 wherein said plasma generator means produces a plasma current sheath including an inverse-pinch discharge.

17. The generator of claim 13 wherein said plasma generator means produces a plasma current sheath including an inverse-pinch discharge.

\* \* \* \* \*